United States Patent [19]

Young et al.

[11] Patent Number: 4,667,326

[45] Date of Patent: May 19, 1987

[54] METHOD AND APPARATUS FOR ERROR DETECTION AND CORRECTION IN SYSTEMS COMPRISING FLOPPY AND/OR HARD DISK DRIVES

[75] Inventors: Mark S. Young, Mountain View; John Drew, Los Gatos; Michael C. Shebanow, Berkeley, all of Calif.

[73] Assignee: Advanced Micro Devices, Inc., Sunnyvale, Calif.

[21] Appl. No.: 685,018

[22] Filed: Dec. 20, 1984

[51] Int. Cl.[4] .................... G06F 11/08; G06F 11/16
[52] U.S. Cl. .................................... 371/40; 371/38
[58] Field of Search .................. 371/37, 38, 39, 40

[56] References Cited

U.S. PATENT DOCUMENTS

| | | | |
|---|---|---|---|
| 3,896,416 | 7/1975 | Barrett | 371/37 |
| 4,172,213 | 10/1979 | Barnes | 371/37 X |
| 4,276,647 | 1/1981 | Thacker | 371/40 |
| 4,467,373 | 8/1984 | Taylor | 371/40 X |

FOREIGN PATENT DOCUMENTS 71913  6/1979  Japan ..................... 371/40

OTHER PUBLICATIONS

J. W. Clough, IBM Technical Disclosure, "Semi-Parallel Generation of CRC Character", 2/1977, pp. 3555-3556.

Primary Examiner—Joesph Ruggiero
Assistant Examiner—Robert W. Beausoliel, Jr.
Attorney, Agent, or Firm—Patrick T. King; Warren M. Becker; J. Vincent Tortolano

[57] ABSTRACT

A method and apparatus for generating a check sum and a syndrome for detecting errors in a series of bytes comprising a plurality of stages, each stage comprising a plurality of networks of exclusive OR gates, a memory and an exclusive OR gate for exclusively ORing the outputs of the networks resulting from a byte transmitted therethrough with the results stored in a memory in a previous stage due to a previous byte. Each of the stages and the networks therein correspond to a term in a Reed-Solomon polynomial. Except for differences in the number and construction of the networks in each stage, each of the stages are substantially identical and can be selectively used for detecting single and double burst errors.

14 Claims, 17 Drawing Figures

METHOD AND APPARATUS FOR ERROR DETECTION AND CORRECTION IN SYSTEMS COMPRISING FLOPPY AND/OR HARD DISK DRIVES

BACKGROUND OF THE INVENTION

1. Field of the Invention

The present invention relates to a method and apparatus for transferring data between a computer and its peripheral apparatus in general and to a method and apparatus for detecting and correcting errors in data transfers between a floppy and/or hard disk drive and a computer in particular.

2. Description of Prior Art

Computer systems of all kinds require storage devices in which is stored computer programs, data and the like. The storage devices may comprise an assemblage of electronic and/or magnetic devices, e.g. flip-flops or latches in the form of registers, magnetic core memories, bubble memories, rotating magnetic drums, or a variety of other types of memory devices such as, for example, a floppy disk memory or a hard disk memory, also known as a Winchester.

Regardless of the type of memory used, signals, referred to generally as data signals irrespective of their informational content, e.g. instructions, numerics, etc., must be transferred to and from the memory device quickly, reliably and preferably with a minimum of computer time involvement.

A floppy disk memory comprises a floppy disk and a floppy disk drive. The floppy disk is a flexible member coated with a magnetic recording medium. The member is permanently housed in a jacket provided with holes for providing access to the recording medium. The floppy disk drive comprises a motor driven spindle, one or more magnetic head members and assdciated electronics mounted in a housing. In use, the disk is removably inserted in the housing. After the disk is inserted in the housing, it is engaged by the spindle which rotates the disk in its jacket. The head members are located in registration with one or more of the holes. Control signals move the head member(s) in the holes from track to track in proximity with the disk and data signals from a computer are recorded on or reproduced from the spinning disk for use by the computer.

A hard or Winchester disk memory is quite similar to a floppy disk memory in some respects and quite different from a floppy disk memory in other respects. It is similar to a floppy disk member in that it records and reproduces data signals on and from a rotating magnetic disk member. It is dissimilar from a floppy disk memory in that the memory typically comprises a plurality of stacked rigid magnetically coated disk members which are permanently housed in the disk drive. In use, magnetic head members, which are also located in the drive, are moved from track to track in proximity with the opposite surfaces of each disk for recording data signals on and reproducing signals from the disk.

The requirement that data transfers between a computer and a memory device be quick, reliable, and preferably involve a minimum of computer time applies equally to both floppy and hard disk memories.

To a certain extent, the above requirements are interrelated. However, for convenience, they may be discussed with respect to two functionally separate aspects of disk memories, namely, head control and data transfers.

Head control involves the apparatus and control signals necessary to move the head members from one track to another in response to addresses received from the computer. For example, the addresses received from the computer must be decoded and corresponding control signals generated to move the heads to the track selected. Movement of the heads to the track selected in turn requires that there be generated control signals corresponding to the location of the heads as they are moved. If, for any reason, a head is not moved to a selected track or is displaced from a selected track due to a malfunction in the apparatus, such as by an equipment failure or an erroneous control signal, a corresponding control signal must be generated to alert the user, abort the operation in progress and/or correct the failure.

Due to the fact that head control involves the movement of electro-mechanical devices, the speed at which track selection occurs and track selection errors are corrected is relatively slow compared to the speed of a computer. Thus, if the computer were required to be directly involved in head control beyond that amount of involvement which is absolutely essential, most of the available performance of the computer would be lost. To avoid such a loss, the majority of head control functions are handled in a separate assembly which eliminates from the computer functions the task of controlling head movement in the disk drive. This assembly is commonly called a disk controller.

Once a head has been moved to a selected track on a disk, data transfers to and from the track may take place. The data transfers to and from the track are serial in nature. If the data received from or to be sent to the computer is parallel, it must be converted. This task may be done in the disk controller.

Generally, disk drives use a particular data format for storing data on the disk. A properly programmed computer in the disk controller may be used to perform this task.

Among other data handling tasks which may be performed by the disk controller is data error detection and correction. As used in digital communications, a data error occurs when a logical bit is reversed. For example, a logical "1" becomes a logical "0" or vice versa. A data error in the data stored on a disk may occur as a result of a voltage or current surge in the equipment as the data is being stored. It may occur due to an extraneous magnetic field which affects the data after it is stored on the disk. Or it may occur as a result of normal wear and tear of the equipment.

In quality disk memories, e.g. Winchester disk drives, the probability of an error occurring for reasons other than normal wear and tear is one in $10^{10}$ bits transferred. Such errors are called soft errors. The probability of an error occurring as a result of normal wear and tear is 1 in $10^{12}$ bits transferred. The latter errors are called hard errors. Errors which occur due to a defect in the disk are mapped out, i.e. eliminated, by making the offending disk sector unavailable for the storage of data.

The task of a data error detection and correction method and apparatus is to detect an error in data stored in a storage medium such as a disk, from a computer or other data source, identify its location and correct it.

In general, data error detection and correction methods and apparatus require the generation of a check sum. As each segment, e.g. byte, of a data stream is transferred from the computer to the disk, a partial check sum, a number corresponding to the data being transferred, is generated using one of a wide variety of well known error detection and correction codes, e.g. Hamming code, Reed-Solomon code, etc. At the end of the data transfer, i.e. after all segments have been transferred, the resultant final check sum is added to the end of and stored with the data on the disk.

When, subsequently, the data and the stored check sum are read from the disk, another check sum is generated as each segment of the data stream is being read. When all of the data and the stored check sum have been read, the newly generated final check sum is compared with the stored check sum. A correspondence between the two indicates the data read is error free. A lack of correspondence indicates that the data read contains an error.

In the case of an error, the lack of correspondence described above results in a number which will identify the location of the error, provided the error detected is within the performance capability of the error detection and correction code being used. If it is, all that is required to correct the error is to invert the bits affected. Because the check sum created during reading contains information identifying an error, if one exists, it is descriptively called a syndrome.

The performance capability of a particular error detection and correction code is determined by the size of the burst in a bit stream of a given length that can be detected and corrected. A burst is defined as a series of contiguous bits and may be one bit long or as long as the entire data record plus the check sum stored therewith. For example, a code which can detect and correct a 10 bit burst in a 256 byte bit stream is usually more powerful than one which can detect only a 5 bit burst in a bit stream of the same length. Similarly, a code which can detect and correct multiple bursts in a bit stream of a given length is more powerful than one which can detect and correct only a single burst in a bit stream of the same length.

A burst may also be defined as a series of bits of a predetermined length in which one or more bit inversions are located. Of the known codes which are available for error detection and correction in general, certain ones are more easily implemented in hardware and software for use in particular cases. For example, for use in detecting and correcting errors in a computer system using a disk memory, the family of Reed-Solomon codes is a preferred code.

Data records are typically 128, 256 or 512 bytes long, or some multiple or submultiple thereof. Currently, data records on floppy and hard disks are typically 512 bytes long.

When an error detection and correction code, such as a Reed-Solomon code, is used for detecting and correcting errors in a data record, the resulting check sum which is stored on the disk at the end of the data record must also be checked for errors during the generation of the syndrome when the data record is read from the disk. Consequently, the check sum/syndrome must be large enough to identify the location of errors in both the data record and the check sum. For example, in a Reed-Solomon code, the symbol size is typically one byte long. Since one byte comprising 8 bits is capable of identifying only $2^8$ or 256 byte locations, it is necessary to use a multiple byte check sum/syndrome to detect and correct errors in a data stream comprising a 256 byte data record and its accompanying check sum.

In practice, the requirement to correct errors in data records larger than the natural addressing ability of the error correction code frequently leads to the use of interleaving. Interleaving comprises generating a check sum using certain of the bytes in a data stream and generating other check sum/syndromes using other ones of the bytes in the data stream. For example, if two interleaves are used, it is the practice to generate one check sum/syndrome using bytes 0, 2, 4, 6 . . . and to generate the other check sum/syndrome using bytes 1, 3, 5, 7 . . . . In this manner, for example, a 256 byte data record can be handled for purposes of error detection and correction as if it comprised two 128 byte records. Since a single byte syndrome is capable of identifying up to 256 error locations, a two byte syndrome is clearly sufficient for identifying error locations in a 256 byte data record and its accompanying check sum.

In addition to increasing the power of the code to detect and correct errors in larger data streams, the practice of interleaving segments also increases the power of a code to detect large sized single burst errors. For example, the use of interleaving permits the detection of bursts which extend over two or more bytes much more readily than can be done without interleaving. This fact is shown in practice and by a mathematical analysis of the performance of any given error detection and correction code with which interleaving may be used.

While conventional error detection and correction codes and their implementation and use are well known, one of the principal disadvantages of prior known Reed-Solomon error detection and correction methods and apparatus has been the fact that the generation of check sums and syndromes has required the use of separate apparatus. That is, one apparatus was used for generating the check sum and a separate apparatus was used for generating the syndrome.

Another disadvantage of prior known Reed-Solomon error detection and correction methods and apparatus has been the fact that there was no easy way to change the performance characteristics of apparatus to handle a more powerful code without extensively modifying the existing apparatus. For example, to change from a single burst correction capability to a double burst correction capability required that an entirely different apparatus had to be used.

SUMMARY OF THE INVENTION

In view of the foregoing, a principal object of the present invention is a novel method and apparatus for generating check sums and syndromes for use in detecting and correcting errors.

Another object of the present invention is a method and apparatus which comprises the use of substantially identical modular units or stages for implementing error detection codes having different performance characteristics.

Still another object of the present invention is a method and apparatus which merely requires a change in the capacity of a memory in each of a plurality of modular units or stages to implement a change in the performance characteristics of a given error detection and correction code.

Still another object of the present invention is a method and apparatus which merely requires a change in the capacity of a memory in each of a plurality of modular units or stages to allow for interleaving the bytes of a data record.

In accordance with the above objects, there is provided a method and an apparatus for detecting and correcting errors using a plurality of selected Reed-Solomon polynomials. For example, the polynomial for detecting a single burst error comprises the following three terms:

$$(x+a^0)(x+a^1)(x+a^2)$$

Additional or fewer terms may be used if desired. The polynomial for detecting a double burst error comprises the following five terms:

$$(x+a^0)(x+a^1)(x+a^2)(x+a^3)(x+^4)$$

Once again, additional or fewer terms may be used if desired.

In the apparatus there is provided a module corresponding to each of the terms in the above described polynomials. Consequently, the apparatus for detecting a single burst error uses three modules or stages and an apparatus for detecting a single and double burst error uses five modules or stages.

In each of the above described modules there is provided a plurality of networks of exclusive OR gates, also called odd or even parity generators, which collectively comprise what is called an alpha multiplier, a pair of multiplexers and a RAM memory coupled to the output of the multiplexers by an exclusive OR gate. Except for the number and construction of the alpha multipliers in each of the modules, the modules are identical.

In the RAM in each of the modules, there is provided an addressable storage space for storing each check byte generated in the module. A check byte is generated in each of the modules as each byte of a data record is processed. After all bytes in the data record have been processed, the check bytes generated in all of the modules are stored with the data record and collectively comprise what is called a check sum. The number of check bytes generated in the module depends on the degree of interleaving required.

Interleaving refers to the process of generating a check byte(s) from selected bytes of a data record. An interleave factor of 1 means, in effect, that there is no interleaving and all bytes in a data record are used to generate a group of one or more check bytes. If an interleave factor of 2 is used, that means that two groups of check bytes are generated, each from alternate bytes in the record. Similarly, if an interleave factor of 3 is used, that means that every third byte in a data record is used for generating one of the three groups of check bytes.

If the length of a data record and the check sum stored therewith after all bytes in the data record have been processed is less than 256 bytes long, the interleave factor need not exceed 1 or a symbol size one byte in length. If, on the other hand, the combination of the data record and the check sum stored therewith does exceed 256 bytes, then an interleave factor of greater than 1 must be used for generating more than one check byte. Thus, the interleaving factor used depends on the size of the data record and the check sum stored therewith and on the symbol size. For example, if a data record is 128 bytes long and single burst error detection is used, the resulting data stream comprising the data record and the check sum comprising the three check bytes, one from each of the modules, stored therewith, is 131 bytes long. Since 131 bytes is less than 256 bytes, an interleave factor of 1, and consequently only one check byte per module, is required to identify all bytes that may contain an error, although more may be used if desired. On the other hand, if the data record is 256 bytes long and single burst error detection is used, an interleave factor of 2 is required. This is because a 256 byte data record and its check sum exceeds 256 bytes and it takes at least two bytes to identify more than 256 byte locations.

A principal advantage of the method and apparatus of the present invention is that by simply adding or removing one or more substantially identical modules to or from one or more existing modules or by simply selecting between available alpha multipliers on a plurality of existing modules, changes can be made in the performance characteristics of an error detection and correction code being used. By thus simplifying the apparatus, the apparatus is less costly to make and can be readily adapted to a specific application with a minimum expenditure of time and money.

Another advantage of the method and apparatus of the present invention is that they lend themselves to the advantages inherent in interleaving data bytes in the process of check sum/syndrome generation. This is possible because of the simplicity inherent in changing the storage capacity of the RAM memories of the individual modules used for storing the check bytes.

BRIEF DESCRIPTION OF THE DRAWING

The above and other objects, features and advantages of the present invention will become apparent from the following detailed description of the accompanying drawing, in which.

DETAILED DESCRIPTION OF THE DRAWING

Figure 1:
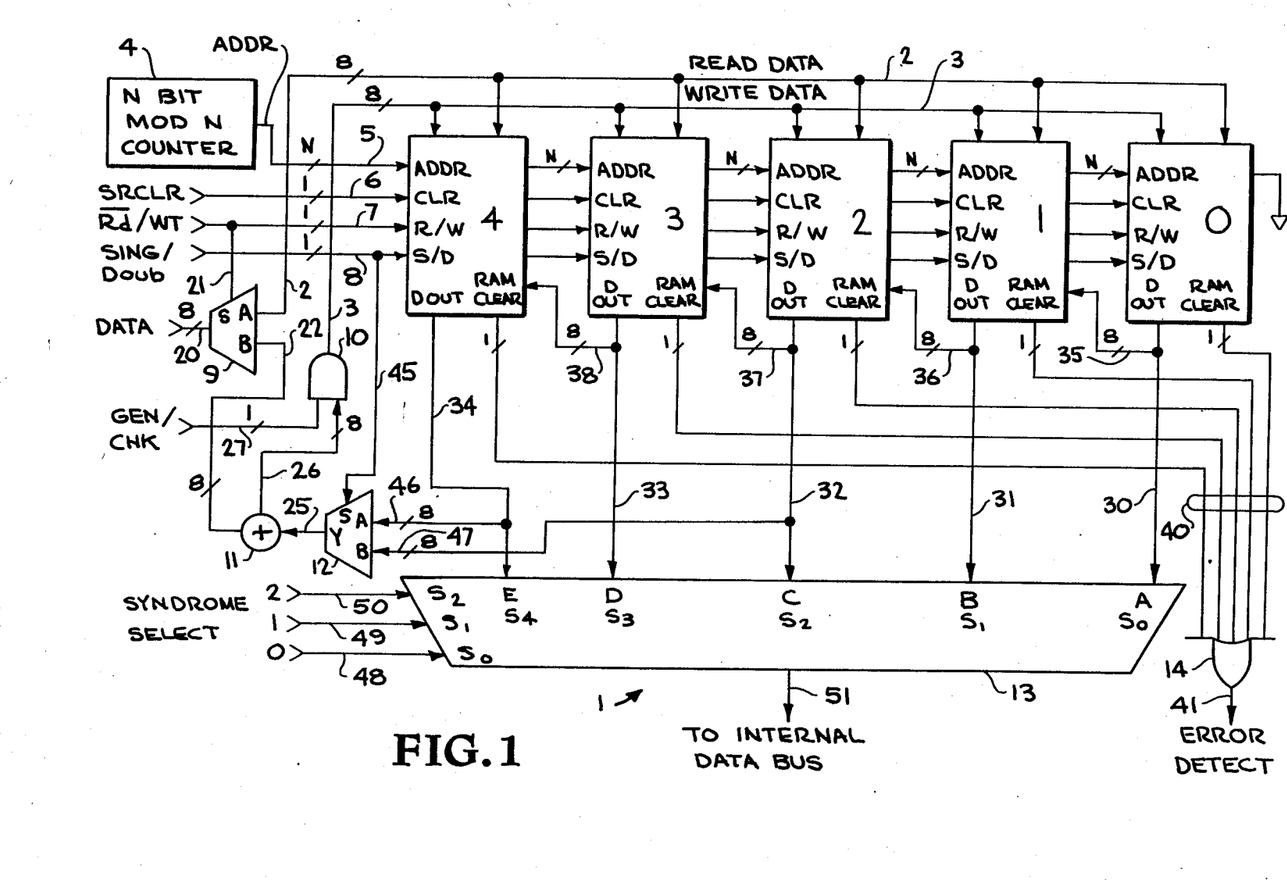
FIG. 1 is a block diagram of apparatus according to the present invention.

Referring to FIG. 1 there is provided in accordance with the present invention an apparatus designated generally as 1 for use in detecting and correcting errors in data transfers between a floppy and/or hard disk drive and a computer or other data processing apparatus. In the apparatus 1 there is provided a plurality of five stages designated 0, 1, 2, 3 and 4. Each of the stages 0-4 are identical except for a plurality of networks of exclusive OR gates, the number and construction of which may vary from stage to stage, as will be described in detail below.

The stages 0-4 are coupled in parallel to a read data bus 2 and a write data bus 3. An N-bit mod M, where $M \leq 2^N$ counter 4 having N output address lines are coupled in parallel to address inputs of each of the stages 0-4 by means of an address bus 5. A memory clear or a memory preset control signal SRCLR is coupled to each of the stages 0-4 by means of a control signal line 6. A read/write control signal $\overline{RD}/WT$ is applied to each of the stages 0-4 by means of a control signal line 7. A single/double burst control signal SING/$\overline{DOUB}$ is applied to each of the stages 0-4 by means of a control line 8.

In addition to the above circuits, there is provided a multiplexer 9, an AND gate 10, an exclusive OR gate 11, a multiplexer 12, a multiplexer 13 and an OR gate 14.

In the multiplexer 9 there is provided an input coupled to a data input bus 20, a control input S coupled to a control signal line 21, an output A coupled to the read data bus 2 and an output B coupled to first inputs of the OR gate 11 by means of a data bus 22. The busses 2, 20 and 22 typically comprise eight data lines upon which is transmitted in parallel a byte of data. The control line 21 is coupled to the read/write control line 7.

In the exclusive OR gate 11 there is provided second inputs coupled to a data bus 25 and an output coupled to a data bus 26. The data bus 26 is coupled to inputs of the AND gate 10. In the AND gate 10 there is also provided an input for receiving a control signal GEN/$\overline{CHK}$ on a control line 27. The outputs of the AND gate 10 are coupled to the write data bus 3.

The stages 0-4 each comprise an output designated DOUT. The outputs DOUT of the stages 0-4 are coupled to a plurality of output busses 30, 31, 32, 33 and 34, respectively. The bus 30 from stage 0 is coupled to stage 1 by means of a bus 35. The bus 31 is coupled to stage 2 by means of a bus 36. The bus 32 of the stage 2 is coupled to the stage 3 by means of a bus 37. The bus 33 from the stage 3 is coupled to the stage 4 by means of a bus 38.

Each of the stages 0-4 also comprise an output designated RAMCLR which is coupled by means of a RAMCLR bus 40 to an input of the OR gate 14. The output of the OR gate 14 is provided on an error detect signal line 41.

In the multiplexer 12 there is provided a control input S coupled to a control input signal line 45, an input A coupled to bus 34 by means of a bus 46 and an input B coupled to bus 32 by means of a bus 47 and an output Y coupled to the bus 25.

In the multiplexer 13 there is provided a plurality of inputs A, B, C, D and E, also designated respectively S0, S1, S2, S3 and S4, and a plurality of address inputs designated S0, S1 and S2 coupled to a plurality of address input lines 48, 49 and 50. The input A is coupled to the bus 30, the input B is coupled to the bus 31, the input C is coupled to the bus 32, the input D is coupled to the bus 33 and the input E is coupled to the bus 34. Additionally, there is provided in the multipler 13 an output coupled to an output data bus 51.

In the above description, unless otherwise indicated, all references to a bus are references to a bus typically comprising eight data lines which are provided for transmitting a byte of data in parallel.

Figure 2:
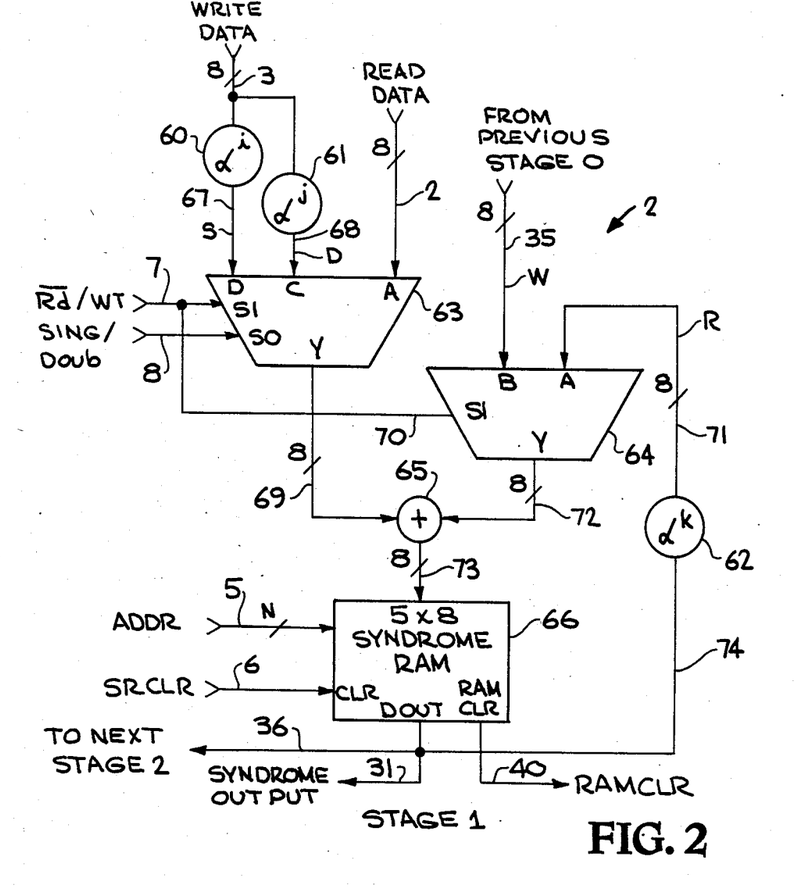
FIG. 2 is a generalized block diagram of one of the stages of the apparatus of FIG. 1.

Referring to FIG. 2, there is shown a generalized block diagram of one of the stages 0-4 described above with respect to FIG. 1. For convenience, the stage shown in FIG. 2 will be described as stage 1 of the apparatus of FIG. 1. It should be understood, however, that with the exception of the number and construction of the networks of exclusive OR gates, all of the stages 0-4, are identical with the stage shown in FIG. 2.

In each of the stages 0-2 there is provided a plurality of networks of exclusive OR gates 60, 61 and 62, also called alpha multipliers, a plurality of multiplexers 63 and 64, an exclusive OR gate 65 and a random access memory (RAM) 66. The inputs to the networks 60 and 61 are coupled in parallel to the write data bus 3. The stages 3 and 4 are generally identical to the stages 0-2 except that network 60 is not required in stages 3 an 4 since they are only used for the generation of a double burst check sum and, of course, the networks in each of the stages may differ, as will be described.

In the multiplexer 63 there is provided a pair of control signal inputs S0 and S1, a plurality of data byte inputs A, C and D and a data output Y. The output S0 is coupled to the control line 8. The output S1 is coupled to the control line 7. The inputs D and C are coupled to the networks 60 and 61 by means of a pair of data busses 67 and 68, respectively. The input A is coupled to the read data bus 2. The output Y is coupled to inputs of the exclusive OR gate 65 by means of a data bus 69.

In the multiplexer 64 there is provided a control signal input S1, a pair of data inputs A and B and a data output Y. The control signal input S1 is coupled to the read/write control signal line 7 by means of a control line 70. The input B is coupled to the output of the memory of the previous stage, as by the bus 35 from the previous stage 0. The input A is coupled to the output of the network 62 by means of a bus 71. The output Y is coupled to inputs of the exclusive OR gate 65 by means of a bus 72.

In addition to the above-described circuit components, there is provided in the exclusive OR gate 65 outputs coupled to an output bus 73.

In the RAM 66 there is provided an address input coupled to the address bus 5, a memory clear input coupled to the SRCLR clear signal line 6, a DOUT coupled to the output bus 31 and a RAM clear output coupled to the RAM clear output bus 40, and an input coupled to the data bus 73. Additionally, the DOUT of the RAM 66 is coupled to the next stage 2 by means of the bus 36, to the input B of the multiplexer 13 by means of the bus 31 and to inputs of the network 62 by means of a bus 74.

Referring to the networks 60, 61 and 62, it will be noted that the networks bear the further designation $\alpha^i$, $\alpha^j$ and $\alpha^k$. Each of these networks as described above comprise a network of exclusive OR gates, which are also known as alpha multipliers. The exponential designation associated with each of the networks 60-62 identifies the construction of each of the networks and may be used in reference to available treatises on Reed-Solomon codes for constructing the networks. For convenience there is provided below a table of the exponential designations for each of the networks in each of the stages. In referring to the table, it will be noted that no designation is provided for $\alpha^i$ in stages 3 and 4. This is because those stages are not used during normal operation of the apparatus for single burst error detection, as will be described below.

| Stage | WRITE Single $\alpha^i$ | WRITE Double $\alpha^j$ | READ $\alpha^k$ |
|---|---|---|---|
| 0 | 3 | 10 | 0 |
| 1 | 60 | 152 | 1 |
| 2 | 59 | 101 | 2 |
| 3 |  | 99 | 3 |

-continued

| | WRITE | | |
|---|---|---|---|
| Stage | Single $\alpha^i$ | Double $\alpha^j$ | READ $\alpha^k$ |
| 4 | | 146 | 4 |

Referring to FIGS. 6-17, there is provided a schematic of each of the networks identified in the above table. In each case the networks comprise a plurality of exclusive OR gates having predetermined inputs coupled to predetermined ones of a plurality of input lines 0-7 and outputs coupled to a plurality of output lines 0-7, respectively. Black dots in each of the FIGS. 6-17 show the connections between the input data lines 0-7 and the inputs to the various OR gates in each of the networks.

Figure 3:
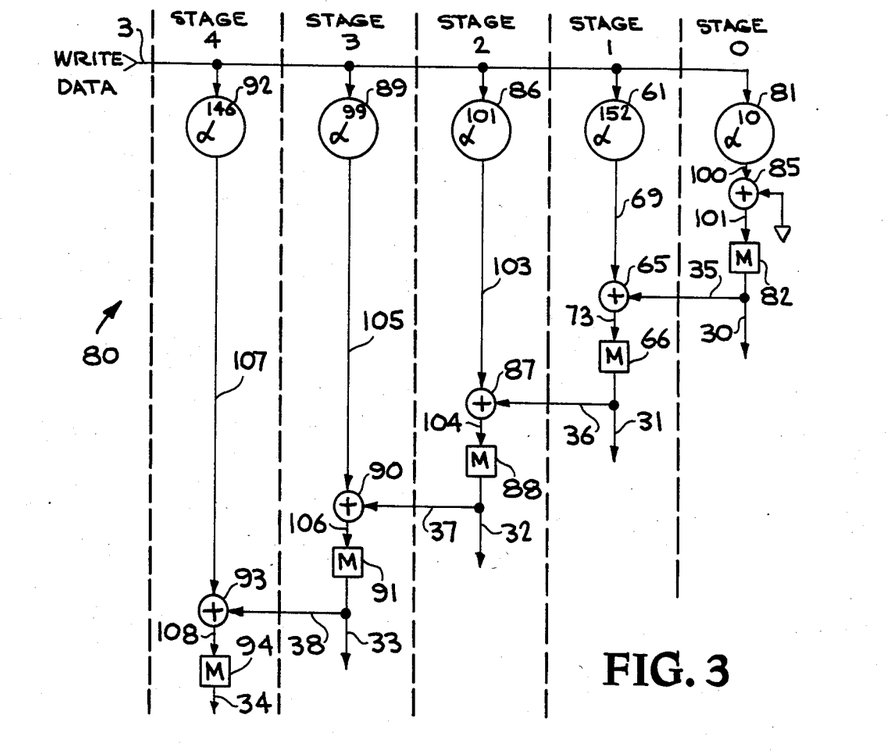
FIG. 3 is a simplified block diagram of the apparatus used for generating a check sum according to the present invention.

Referring to FIG. 3, there is shown a simplified block diagram of an apparatus designated generally as 80 for generating, in accordance with the present invention, a check sum for detecting a double burst error. In the apparatus 80 there is provided five stages 0-4 which correspond to stages 0-4 of the apparatus of FIG. 1. In stage 0 there is provided an alpha multiplier 81, also designated $\alpha^{10}$, an exclusive OR gate 85 and a RAM 82. In stage 1, as described above with respect to FIG. 2, there is provided the alpha multiplier 61, also designated $\alpha^{152}$, the exclusive OR gate 65 and the RAM 66. In stage 2 there is provided an alpha multiplier 86, also designated $\alpha^{101}$, an exclusive OR gate 87 and a RAM 88. In stage 3 there is provided an alpha multiplier 89, also designated $\alpha^{99}$, an exclusive OR gate 90 and a RAM 91. In stage 4 there is provided an alpha multiplier 92, also designated $\alpha^{146}$, an exclusive OR gate 93 and a RAM memory 94.

The inputs of the alpha multipliers 81, 61, 86, 89 and 92 are coupled in parallel to the write data bus 3. The outputs of the alpha multiplier 81 in stage 0 are coupled to inputs of the exclusive OR gate 85 by means of a bus 100. Other inputs of OR gate 85 corresponding to the prior stage inputs described below are coupled to ground. The outputs of the gate 85 are coupled to the inputs of the memory 82 by means of a bus 101.

The outputs of the alpha multiplier 61 in stage 1 are coupled to inputs of exclusive OR gate 65 by the bus 69. The outputs of the exclusive OR gate 65 are coupled to the inputs of the memory 66 by means of the bus 73. Other inputs of the gate 65 are coupled to the output of the memory 82 in the previous stage 0 by means of the bus 35.

The outputs of the alpha multiplier 86 in stage 2 are coupled to inputs of the exclusive OR gate 87 by means of a bus 103. The outputs of exclusive OR gate 87 are coupled to the inputs of the memory 88 by means of a bus 104. Other inputs of the gate 87 are coupled to the output of the memory 66 in the previous stage 1 by means of the bus 36.

The outputs of alpha multiplier 89 in stage 3 are coupled to inputs of exclusive OR gate 90 by means of a bus 105. The outputs of exclusive OR gate 90 are coupled to inputs of the memory 91 by means of a bus 106. Other inputs of the gate 90 are coupled to the output of the memory 88 in the previous stage 2 by means of the bus 37.

The outputs of the alpha multiplier 92 in stage 4 are coupled to inputs of exclusive OR gate 93 by means of a bus 107. The outputs of exclusive OR gate 93 are coupled to the inputs of memory 94 by means of a bus 108. Other inputs of the gate 93 are coupled to the output of the memory 91 in the previous stage 3 by means of the bus 38. As described above with respect to FIG. 1, the busses 30, 31, 32, 33 and 34 couple the outputs of the memories 82, 66, 88, 91 and 94 to the multiplexer 13.

Referring to FIGS. 1 and 2, in preparation for generating a check sum for detecting a double burst error in accordance with the present invention, a clear memory control signal SRCLR is applied to the control line 6 for presetting the memories 82, 66, 88, 91 and 94 in the stages 0-4 to a desired initial value, e.g. zero. Thereafter, in response to a write control signal applied to the control line 7, a double burst control signal $\overline{DOUB}$ applied to the control line 8 and a generate check sum control signal GEN applied to the control line 27, data applied to the data bus 20 is transmitted through the multiplexer 9, the exclusive OR gate 11, the AND gate 10 and via the write data bus 3 through the alpha multiplier designated $\alpha^j$ in each of the stages 0-4, corresponding to the network 61 of FIG. 2 and thence to input C of the multiplexer 63.

Referring again to FIG. 3, there is shown only those alpha multipliers, and the OR gates and memories of stages 0-4 which are actively involved in the generation of a double burst check sum. After the memories 82, 66, 88, 91 and 94 are cleared, each byte in a series of bytes is applied to the write data bus 3. As each byte in the series of bytes is applied to the write data bus 3, it is transmitted in parallel through the networks 81, 61, 86, 89 and 92. Because all memories in stages 0-4 are initially reset to zero, the outputs of the networks 81, 61, 86, 89 and 92 in response to the first byte are unaffected by the contents of the memory in a previous stage and are transmitted through their respective OR gates 85, 65, 87, 90 and 93 and stored in the memories 82, 66, 88, 91 and 94, respectively, without alteration. It may be noted that since OR gate 85 in stage 0 is not connected to a prior stage, the output of network 81 is always stored in memory 82 without alteration.

When the next byte of data is applied to the write data bus 3, it is similarly transmitted in parallel to the networks 81, 61, 86, 89 and 92. At that point the output of the network 81 is simply transmitted through the OR gate 85, the output of the network 61 in stage 1 is exclusively ORed with the contents of the memory 82 in stage 0, the output of the network 86 in stage 2 is exclusively ORed with the contents of the memory 66 in stage 1, the output of the network 89 in stage 3 is exclusively ORed with the contents of the memory 88 in stage 2, and the output of the network 92 in stage 4 is exclusively ORed with the contents of the memory 91 in stage 3. Thereafter, the contents of each of the memories due to the first byte are replaced by the output of the exclusive OR gates coupled thereto due to the second byte.

The above-described operations are thereafter repeated for each byte in the series of bytes.

In practice, the holding of the contents in the memories due to each byte until after the next byte has been processed with those contents is accomplished using conventional master-slave memories and suitable clocking signals, not shown. Of course, other types of memories may also be used for this purpose.

After the last byte in the series of bytes has been transmitted through the networks 81, 61, 86, 89 and 92, and exclusively ORed with the contents of the memory in the preceding stage due to the preceding byte in the series, the memories 82, 66, 88, 91 and 94 contain a plurality of bytes, which collectively comprise the check sum. The check sum thus generated is then added to the end of the series of bytes and stored to disk.

Figure 4:
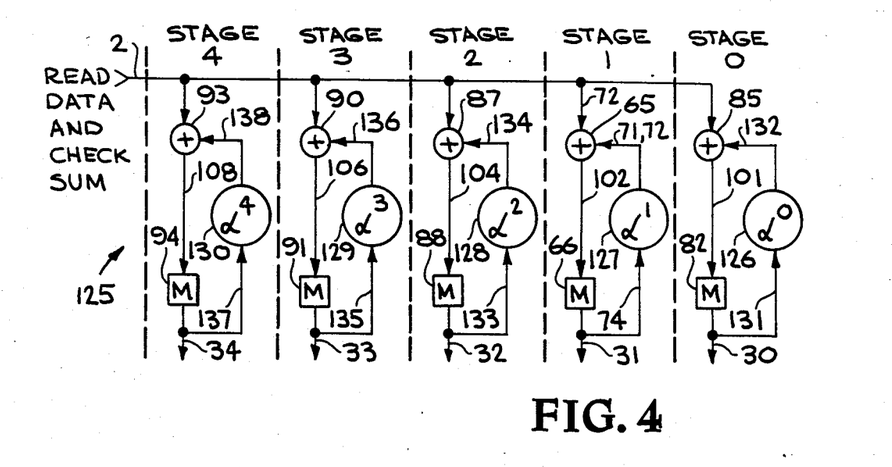
FIG. 4 is a simplified block diagram of the apparatus used for generating a syndrome according to the present invention.

Referring to FIG. 4, there is shown a simplified block diagram of the apparatus designated generally as 125 in the stages 0-4 which is used for generating a syndrome. In the apparatus 125 there is provided a plurality of alpha multipliers 126, 62, 128, 129 and 130, also designated $\alpha^0$, $\alpha^1$, $\alpha^2$, $\alpha^3$ and $\alpha^4$, respectively. The multiplier 126 in stage 0 is coupled to the output of the memory 82 of stage 0 by means of a bus 131 and to inputs of the OR gate 85 by means of a bus 132. The multiplier 62 in stage 1, corresponding to the $\alpha^k$ multiplier designated as 62 in FIG. 2, is coupled to the output of memory 66 by means of the bus 74 and to inputs of the OR gate 65 by means of the busses 71, 72, as described above with respect to FIG. 2. The alpha multiplier 128 in stage 2 is coupled to the output of the memory 88 by means of a bus 133 and to inputs of the OR gate 87 by means of a bus 134. The multiplier 129 in stage 3 is coupled to the output of the memory 91 in stage 3 by means of a bus 135 and to inputs of the OR gate 90 by means of a bus 136. The multiplier 130 in stage 4 is coupled to the output of the memory 94 by means of a bus 137 and to inputs of the OR gate 93 by means of a bus 138.

In operation, the memories 82, 66, 88, 91 and 94 in the stages 0-4 respectively, are initially preset to a desired value, e.g. zero, by a clear control signal SRCLR applied to the control line 6. Thereafter, in response to a read control signal $\overline{RD}$ on the control line 7 and a check signal $\overline{CHK}$ on the control line 27, bytes comprising a data record and a check sum stored therewith are serially applied to the data bus 20 from a disk and transmitted through the multiplexer 9 onto the read data bus 2, as described above with respect to FIGS. 1 and 2. As each byte of data and the check sum stored therewith is applied to the read data bus 2, it is transmitted in parallel through the OR gates 85, 65, 87, 90 and 93 of the stages 0-4, respectively. Since memories 82, 86, 88, 91 and 94 are initially cleared to zero, the first byte applied to the read bus 2 is stored in these memories without alteration. After the first byte is stored in the memories in each of the stages 0-4, the contents of the memories are transmitted to the alpha multipliers 126-130 coupled thereto.

When the next byte is applied to the read data bus 2, it is exclusively ORed in each of the stages 0-4 with the output of the alpha multiplier in that stage. Thereafter, the contents of the memory in each of the stages due to the preceding byte is replaced by the output of the OR gate coupled thereto to generate an intermediate syndrome.

The above-described process is repeated for each byte in the series of data bytes as well as for the bytes in the check sum stored therewith. When the last of the bytes in the check sum has been exclusively ORed with the output of the alpha multiplier in each of the stages due to the preceding byte, the memories 82, 66, 88, 91 and 94 contain the syndrome.

As described above with respect to the generation of a check sum, the contents of the memories due to a byte are not changed until after the next byte has been processed by those contents. Only then are the contents replaced by the results of the processing of the next byte for use in processing the following byte.

In effect, the apparatus of FIG. 4 in generating the syndrome, operates on the check sum stored with the data in such a manner that if no error exists in either the data or the check sum, the contents of the memories 82, 86, 88, 91 and 94 will be zero after the last byte in the check sum has been processed. However, if an error exists, one or more of the memories 82, 66, 88, 91 and 94 will contain one or more bits of a predetermined logical level, e.g. logical 1.

Referring again to FIG. 1, when the syndrome has been generated, the contents of the memories 82, 66, 88, 91 and 94 are checked by means of the OR gate 14 via the bus 40. If a logical 1 appears in any one of the memories 82, 66, 88, 91 and 94, a logical 1 will appear on the output of the OR gate 14 on the error detect line 41. At that point, by addressing the multiplexer 13, using the address lines 48-50 and the memories using the address bus 5, the contents of the memories 82, 66, 88, 91 and 94 can be read out to the internal data bus on the bus 51 for further processing. The further processing will usually involve the use of software or other apparatus, not shown, to correct the error, the location of which can be derived from the contents of the memories.

Because a single byte comprises eight bits, it is capable of identifying the location of errors in only $2^8$, or 256 bytes. Consequently, in order to identify the location of errors in data streams having more than 256 bytes, it is necessary to either generate syndromes comprising symbols of more than eight bits in each of the stages 0-4, or to manipulate the bytes in the data stream to make the data stream appear to have less than 256 bytes. One of the ways in which data streams are manipulated to appear to have less than 256 bytes is to interleave the data bytes.

Figure 5:
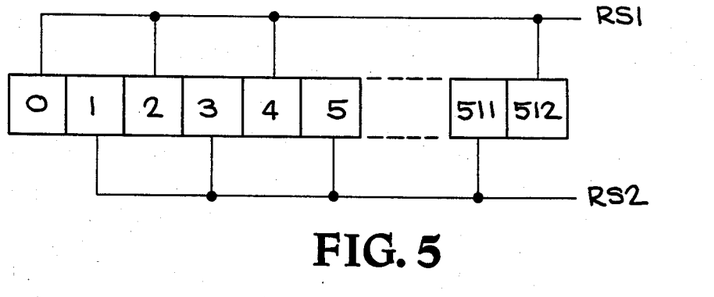
FIG. 5 is a representation showing interleaving as applied to a bit stream according to the present invention.
Figure 6:
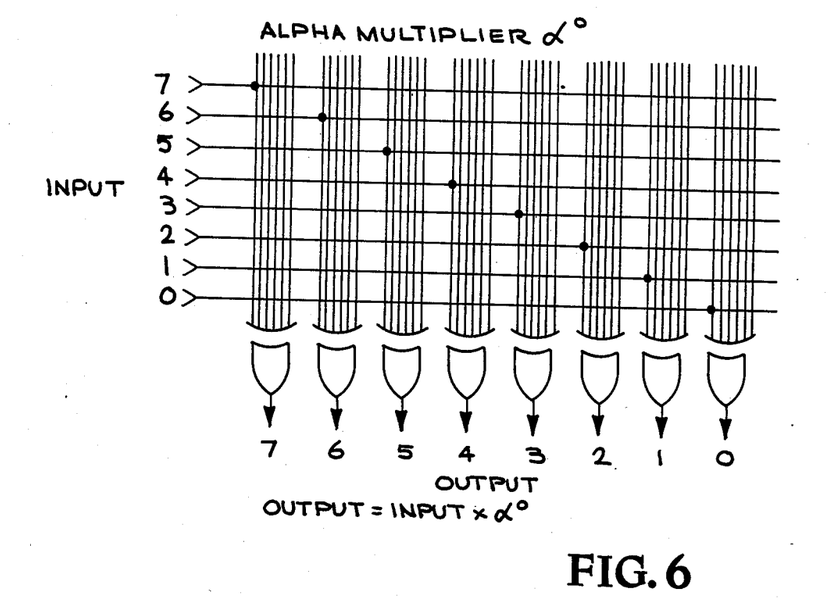
FIGS. 6-17 are schematics of networks of exclusive OR gates called alpha multipliers according to the present invention.
Figure 7:
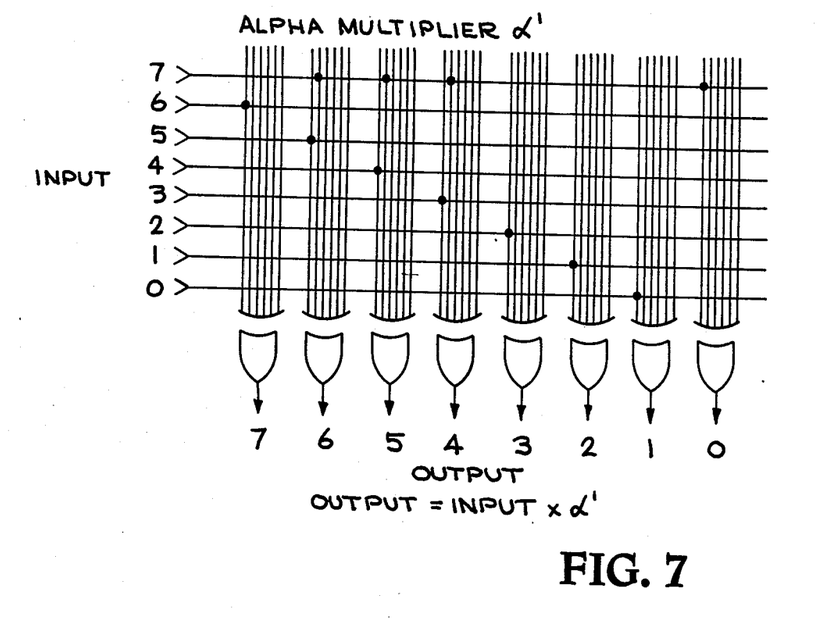
Figure 8:
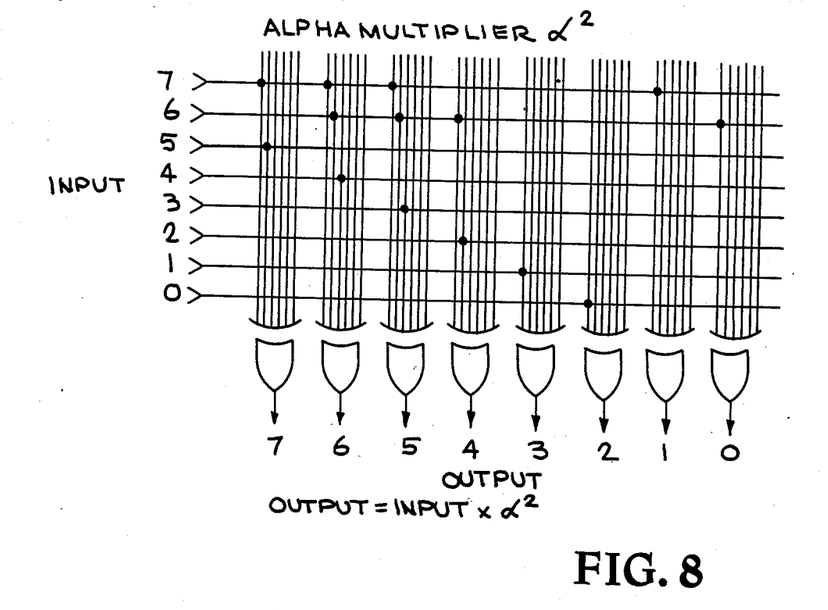

Referring to FIG. 5, there is shown a schematic representation of interleaving using a factor of 2. Interleaving with a factor of 2, as embodied in the present invention, is to generate one of two check sum/syndromes using the even bytes, e.g. 0, 2, 4 . . . and to generate a second check sum/syndrome using the odd bytes, e.g. 1, 3, 5 . . . In this manner, the apparatus of the present invention is capable of generating check sums and syndromes for data streams comprising more than 256 bytes.

Whenever interleaving is used, the memories in each of the stages 0-4 are provided to have an addressable memory space associated with each of the check sums/syndromes stored therein. For example, if no interleaving is used, the memories in each of the stages 0-4 comprise a single byte of storage. If interleaving comprising a factor of 2 is used, the memories in each of the stages 0-4 comprise two addressable bytes of storage. Similarly, if interleaving with a factor of 3 is used, i.e. every third byte in a data stream is used for generating a check sum/syndrome, the memories in each of the stages 0-4 comprise three addressable bytes of storage, and so on.

Figure 9:
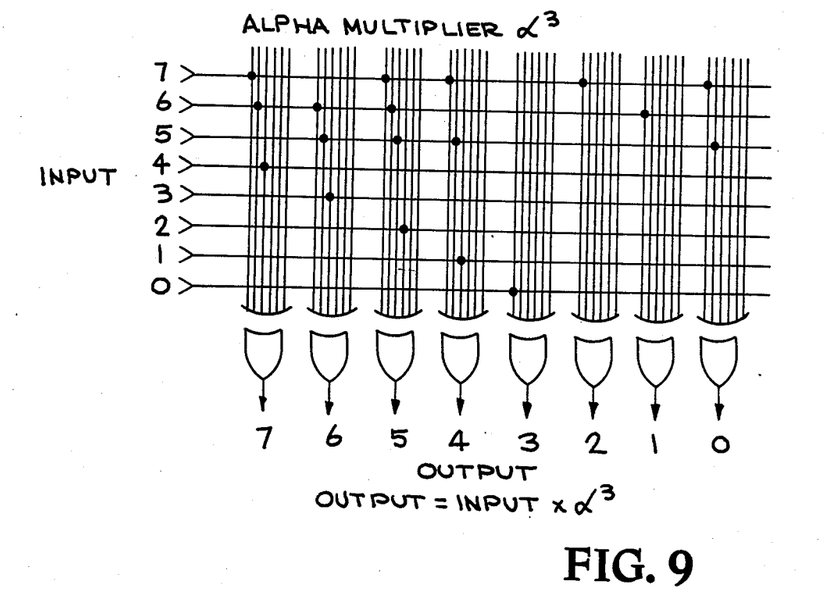
Figure 10:
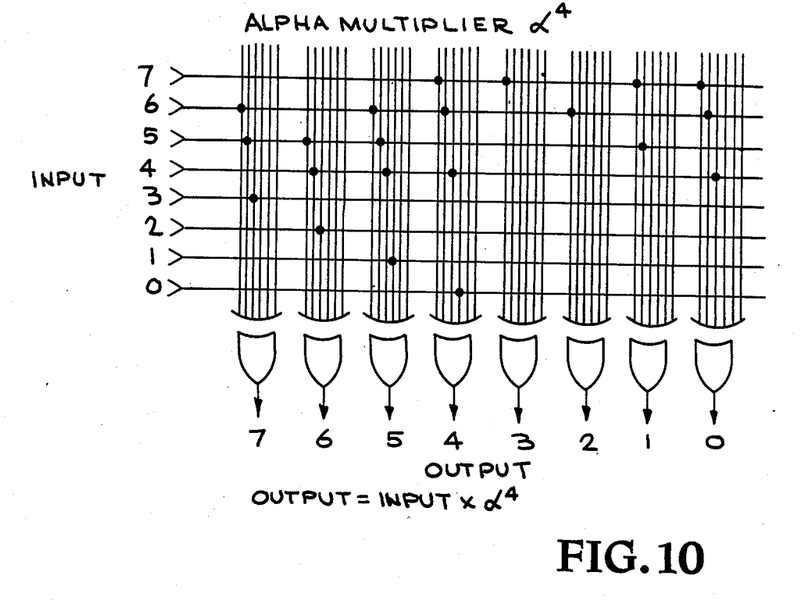
Figure 11:
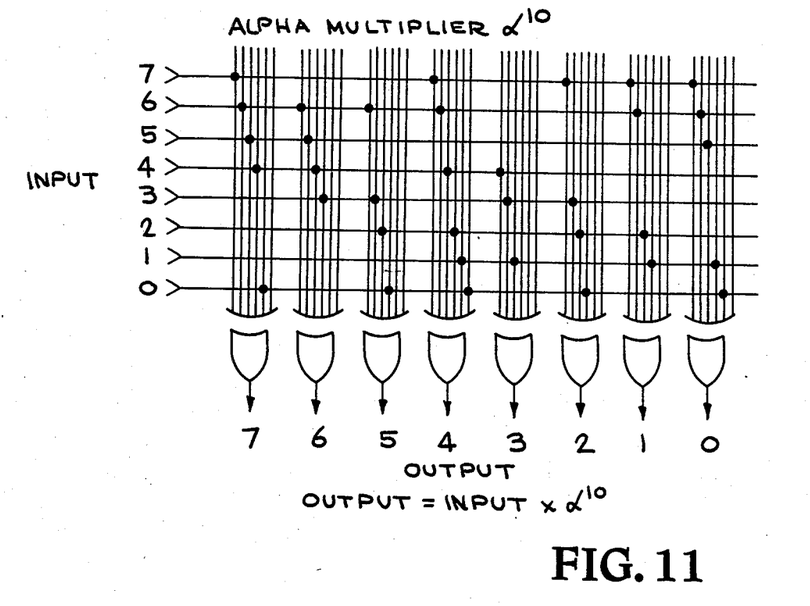
Figure 12:
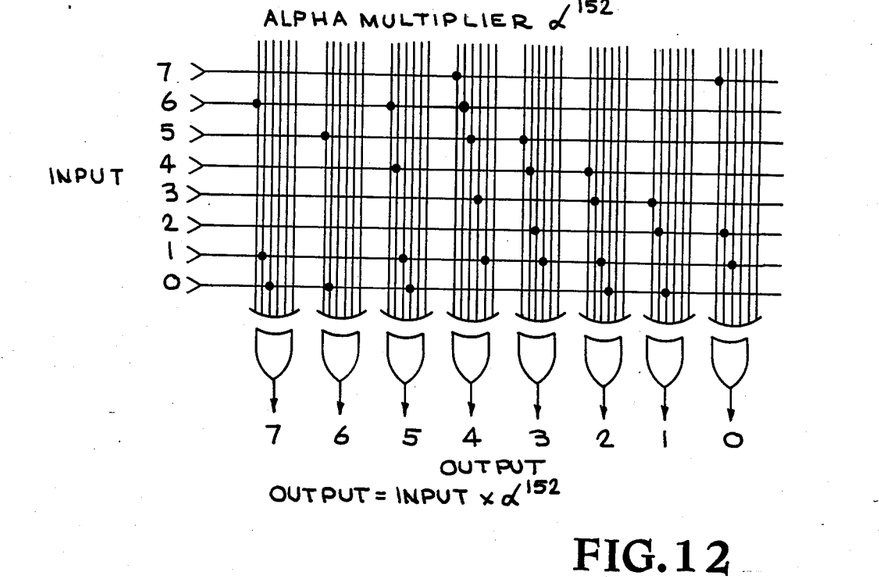
Figure 13:
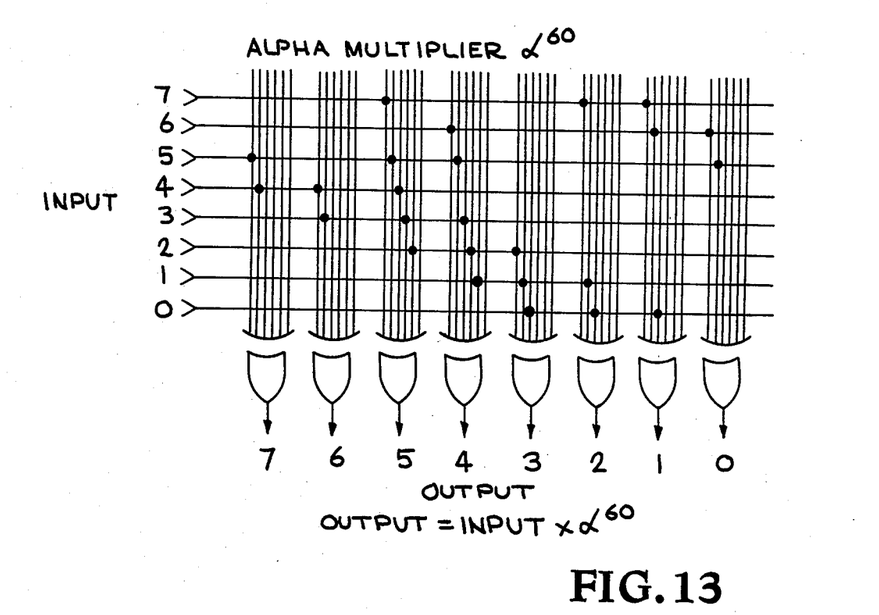
Figure 14:
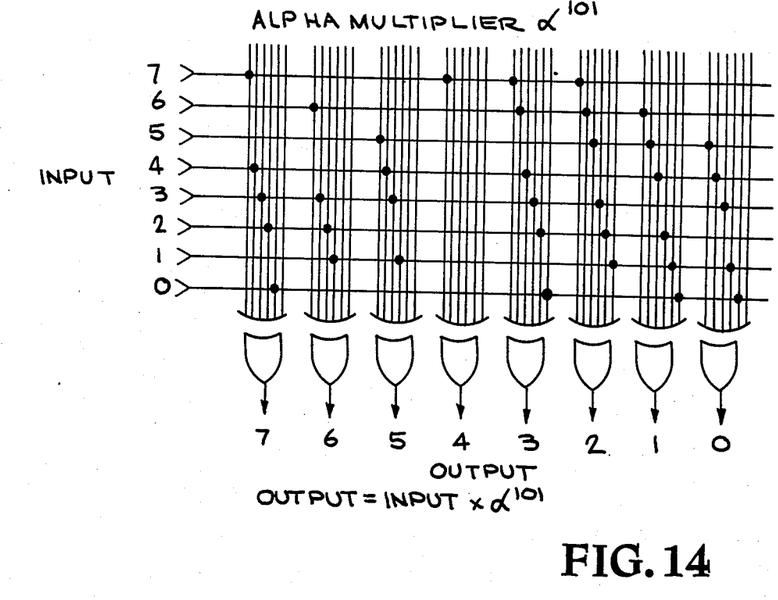
Figure 15:
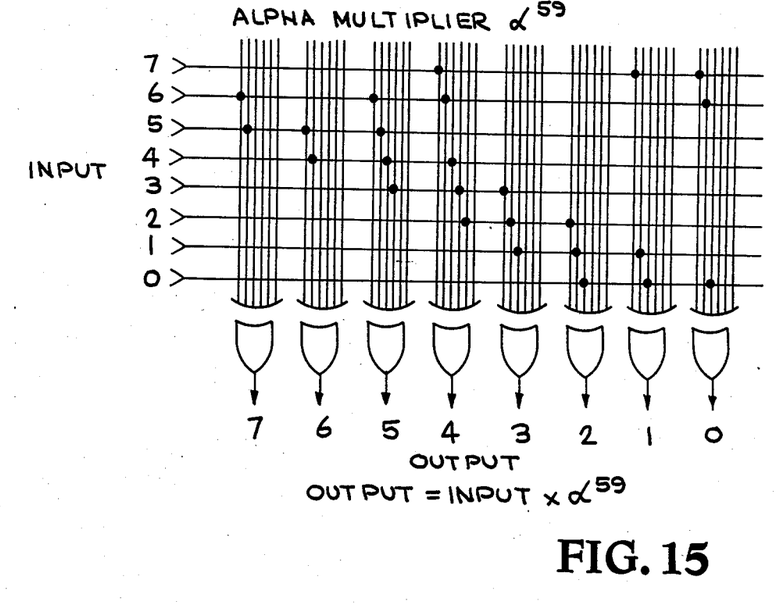
Figure 16:
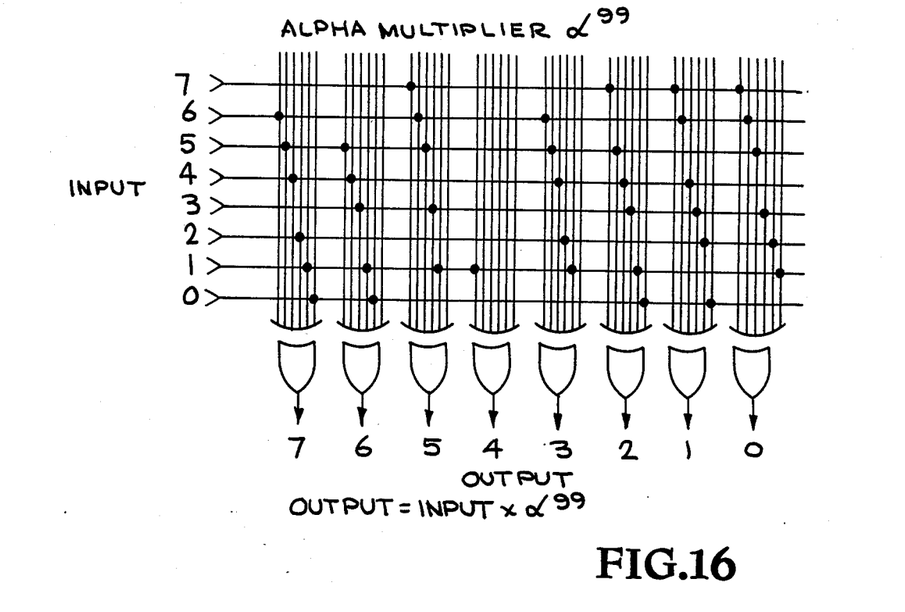
Figure 17:
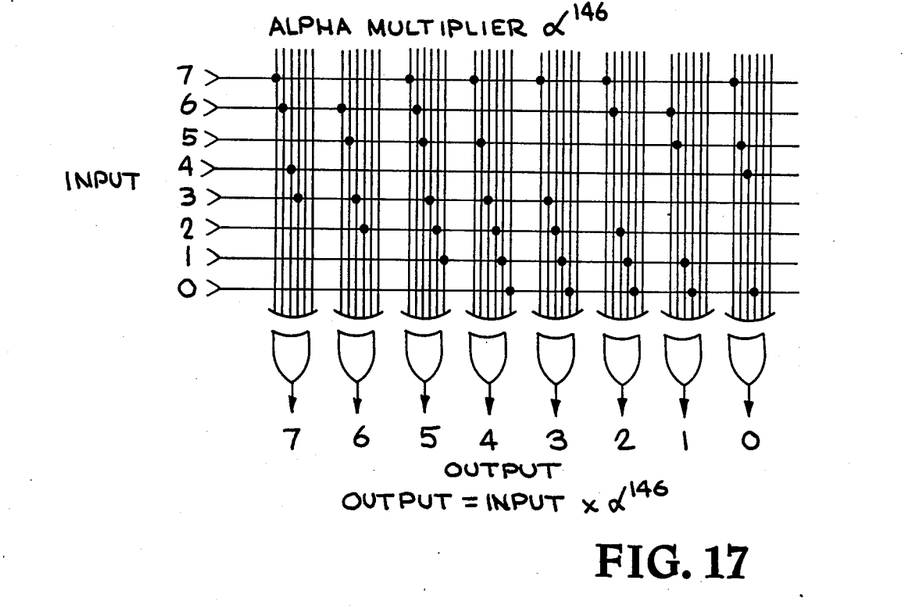

While a preferred embodiment of the present invention is disclosed and described, it is contemplated that various modifications may be made thereto without departing from the spirit and scope of the present invention. For example, the embodiment of FIGS. 1, 3 and 4 is described as an embodiment of an apparatus for detecting a double burst error using a five-term Reed-Solomon polynomial in a data stream comprising a data record and check sum of less than 256 bytes. If it is desired to generate a check sum/syndrome for detecting a single burst error using a three-term Reed-Solomon polynomial, only stages 0, 1 and 2 are required to be used and the alpha multipliers 81, 61 and 86 described above with respect to FIG. 3 will be replaced by the alpha multipliers designated $\alpha^j$ in the table above which will be constructed as shown in FIGS. 9, 13 and 15. In practice, however, the described replacement is accomplished simply by providing all required alpha multipliers in each of the stages and selecting among them by using the multiplexer 63 under the control of the control signals SING/$\overline{DOUB}$ applied to the control line 8.

As indicated above, if interleaving is required or desirable, it is a simple matter to merely expand the capacity of the memories in each of the stages and to provide the necessary control signals to generate a corresponding number of check/syndrome bytes.

For the foregoing reasons, the embodiment shown and described above is intended only to illustrate the present invention and the scope thereof should not be limited thereto, but be determined by reference to the claims hereinafter provided.

What is claimed is:

1. In an error detection and correction apparatus comprising a series of stages, each of said stages having a first and a second network of exclusive OR gates, a single exclusive OR gate having a first input, a second input and an output, a memory device, means for selectively coupling said first input to said first network and said first location, means for coupling said output to said memory device, means for selectively coupling said second input to the output of the memory device in another stage and to said second network and means for coupling the output of said memory device in each stage to said second network; a method for detecting and correcting errors in data being transferred between a first location and a second location comprising the steps of:
   (a) initializing the contents of the memory device in each of said stages;
   (b) transferring each byte in said series of bytes from said first location through said first network in each of said stages;
   (c) exclusively ORing the output of said first network in each of said stages with said output of said memory device in said other stage which was generated in response to a preceding byte in said series;
   (d) storing the results of said latter step in said memory device of said stage;
   (e) repeating steps (b)-(d) until each of said bytes in said series has been transferred through said series of stages and the contents of the memory device in each of said stages comprises a check sum;
   (f) storing said series of bytes and said check sum in the memory device in each of said stages to said second location;
   (g) initializing the contents of the memory device in each of said stages;
   (h) exclusively ORing each of said bytes in said series and said check sum stored therewith at said second location with an output from said second network of exclusive OR gates which is generated in response to the contents of the memory device in said stage;
   (i) storing the results of said latter step in said memory device;
   (j) repeating steps (h) and (i) until each of said bytes in said series and said check sum has been transferred from said second location through said series of stages and the contents of the memory device in each of said stages comprises a syndrome; and
   (k) providing an error detect signal if any one of said bytes in said syndrome comprises a predetermined logical level.

2. In an error detection and correction apparatus comprising a series of stages, each of said stages having a first and a second network of exclusive OR gates, a single exclusive OR gate having a first input, a second input and an output, a memory device, means for selectively coupling said first input to said first network and said first location, means for coupling said output to said memory device, means for selectively coupling said second input to the output of the memory device in another stage and to said second network and means for coupling the output of said memory device in each stage to said second network; a method of detecting and correcting errors in data being transferred between a first location and a second location comprising the steps of:
   (a) initializing the contents of the memory device in each of said stages;
   (b) transferring a first byte in said series from said first location through a first network of exclusive OR gates in each of said series of stages;
   (c) exclusively ORing the output of each of said first networks in each of said stages with the initial contents of said memory in another stage;
   (d) storing the output of said single exclusive OR gate in said memory in each of said stages; thereafter
   (e) transferring the next byte in said series from said first location through each of said first networks in each of said stages;
   (f) exclusively ORing the output of each of said first networks in each of said stages resulting from said previous step with the contents of said memory in said other stage of said series of stages which resulted from the immediate previous byte in said series;
   (g) replacing the contents of each of said memories in each of said stages due to said immediate previous byte with the results of said preceding step;
   (h) repeating steps (e)-(g) for each remaining byte in said series whereupon, at the completion thereof, the combined contents of said memories in said stages comprises a check sum comprising a plurality of bytes to be stored with said series of bytes;
   (i) initializing the contents of the memory device in each of said stages;
   (j) exclusively ORing the first byte in said series of bytes and check sums with the output of each of the said second networks;
   (k) storing the result of said latter step in each of said memories in each of said stages; thereafter
   (l) transferring the contents of each of said memories through a second network in each of said stages;
   (m) exclusively ORing the output of each of said second networks with the next byte in said series of bytes and check sum;
   (n) replacing the contents of each of said memories resulting from said previous byte with the results of said latter step; thereafter;
   (o) repeating steps (l)-(n) for each byte in said series of bytes and check sum whereupon, at the completion thereof, the combined contents of said memories in said stages comprises a syndrome comprising a plurality of bytes; and
   (p) detecting whether any of said bytes in said syndrome comprises a bit having a predetermined logical level.

3. A method according to claim 2 wherein each of said stages and said networks therein corresponds to a predetermined term in a Reed-Solomon error detection polynomial.

4. A method according to claim 2 comprising the step of storing the bytes forming said check sum at the end of said series of bytes.

5. A method for generating a check sum for detecting errors in a series of bytes in an apparatus having a memory in each of a series of stages comprising the steps of:
   (a) applying each byte in said series to a network exclusive OR gates in each of said series of stages;
   (b) applying simultaneously to inputs of an exclusive OR gate in each of said stages the output of the network in said stage and the contents of the memory in a preceding stage
   (c) storing in said memory in each of said stages the output of said exclusive OR gate in said stage for use in processing the next byte in the next stage such that upon completion of the processing of all of said bytes in said series, said memories contain a check sum to be stored with said series.

6. A method of generating a syndrome for detecting errors in a series of bytes comprising a data record and a check sum comprising the steps of:
   (a) applying simultaneously to the inputs of an exclusive OR gate in each of a plurality of stages, each byte in said series of bytes and the output of a network of an exclusive OR gate; thereafter
   (b) storing the output of said OR gate in a memory in said stage for use by said network in processing the next byte such that upon completion of the processing of all bytes in said series, the combined contents of the memories in all of said stages comprise a syndrome; and
   (c) providing a predetermined output if said syndrome comprises a bit having a predetermined logical level.

7. An apparatus for generating a check sum and a syndrome for detecting errors in a series of bytes comprising:
   (a) a write data bus;
   (b) a read data bus; and
   (c) a plurality of stages, each comprising:
      (i) a first and a second network of exclusive OR gates;
      (ii) means for coupling said first of said networks to said write data bus;
      (iii) an exclusive OR gate;
      (iv) a memory for receiving outputs from said exclusive OR gate;
      (v) first means for selectively coupling said exclusive OR gate to said first network in response to a write control signal and to said read data bus in response to a read control signal;
      (vi) means for coupling an output of said memory to said second network; and
      (vii) second means for selectively coupling said OR gate to an output of said second network in response to said read control signal and to an output of said memory in another of said stages in response to said write control signal.

8. An apparatus according to claim 7 wherein said first and said second selective coupling means comprises a first and a second multiplexer.

9. An apparatus according to claim 7 comprising means coupled to said memory in each of said stages for indicating when one of said memories is storing a bit having a predetermined logical level.

10. An apparatus according to claim 7 wherein said first network in each of said stages comprises a plurality of networks of exclusive OR gates and said first selective coupling means comprises means responsive to a control signal for selectively coupling the output of each of said plurality of networks to said exclusive OR gate.

11. An apparatus according to claim 7 comprising means for reading out the contents of said memory in each of said stages to an internal data bus.

12. An apparatus according to claim 7 wherein each of said networks comprises a network of exclusive OR gates corresponding to a term in a Reed-Solomon error detection and correction polynomial.

13. An apparatus according to claim 7 wherein said memory in each of said stages comprises means for storing a plurality of bytes.

14. An apparatus according to claim 13 wherein said memory in each of said stages comprises means for presetting said memory.

* * * * *